United States Patent
Chu et al.

(10) Patent No.: US 6,396,286 B1
(45) Date of Patent: May 28, 2002

(54) APPARATUS AND METHOD FOR TESTING COMPUTER EQUIPMENT FOR SUSCEPTIBILITY TO NEUTRAL TO GROUND NOISE

(75) Inventors: King M. Chu, Wappingers Falls; William M. Lorenz, Saugerties; Tuan D. Ngo; Prabjit Singh, both of Poughkeepsie; Gerald J. Fahr, Wappingers Falls; John P. McConnell, Hurley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/454,395

(22) Filed: Dec. 3, 1999

(51) Int. Cl.[7] .................. G01R 27/02; G01R 29/26; G01R 23/16
(52) U.S. Cl. ............. 324/603; 324/613; 324/628; 324/536; 324/76.12
(58) Field of Search ................ 324/536, 613, 324/628, 603, 16.12

(56) References Cited

U.S. PATENT DOCUMENTS

| | | | | |
|---|---|---|---|---|
| 4,023,098 A | * | 5/1977 | Roth | 324/603 |
| 4,417,207 A | * | 11/1983 | Sato | 324/603 |
| 4,419,628 A | * | 12/1983 | Sato | 324/603 X |
| 4,973,911 A | | 11/1990 | Marshall | 324/628 |
| 4,996,488 A | | 2/1991 | Nave | 324/613 |
| 5,017,878 A | | 5/1991 | Nave | 324/613 |
| 5,668,507 A | * | 9/1997 | Boerstler et al. | 324/613 X |
| 5,729,145 A | * | 3/1998 | Blades | 324/536 |

* cited by examiner

Primary Examiner—N. Le
Assistant Examiner—Wasseem H. Hamdan
(74) Attorney, Agent, or Firm—Floyd A. Gonzalez; James E. Murray

(57) ABSTRACT

The power supply of equipment being tested for common mode noise problems is connected to a source of power with the power and neutral input terminals of the power supply isolated from the power ground. Recorded common mode noise signals are then inserted between the power supply's neutral input terminal and power ground to produce problem conditions. When the cause of the problem conditions are identified, steps are taken to eliminate the condition.

12 Claims, 3 Drawing Sheets

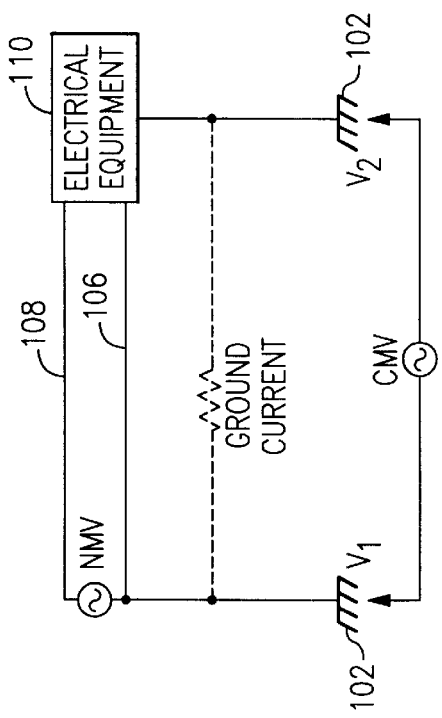
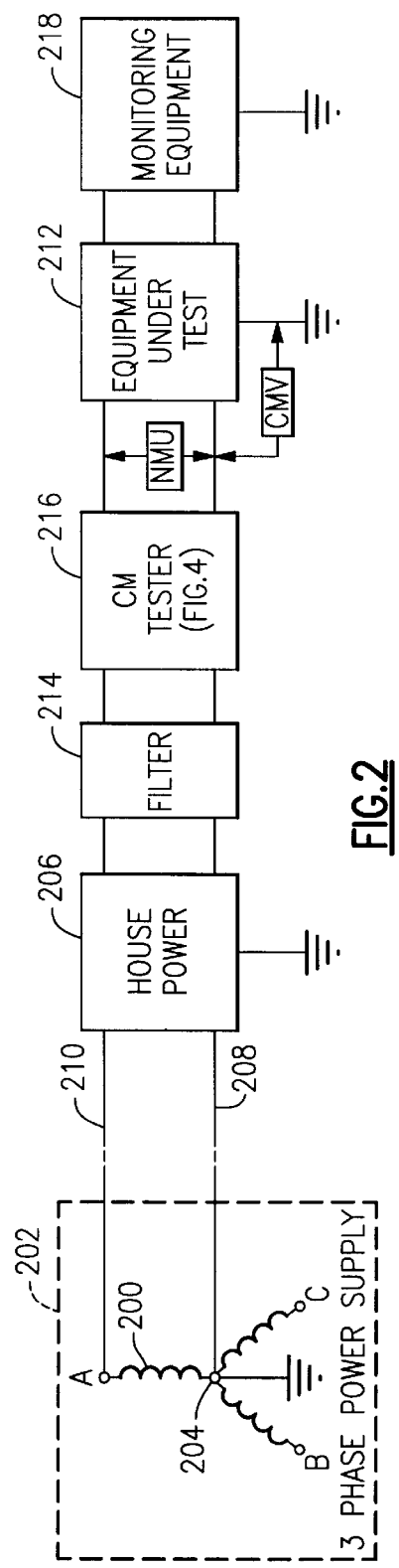

APPARATUS AND METHOD FOR TESTING COMPUTER EQUIPMENT FOR SUSCEPTIBILITY TO NEUTRAL TO GROUND NOISE

FIELD OF THE INVENTION

The present invention relates to the susceptibility of electrical equipment to power line noise. More particularly, this invention relates to the testing for and correction of the susceptibility of a computer system to common mode noise on lines supplying power to the system.

BACKGROUND OF THE INVENTION

Electrical power lines transmit electrical noise to equipment powered by the power lines. Once category of such noise is common mode noise. Common mode noise is a common mode voltage (CMV) or voltage that is present on both leads of an analog input with respect to an analog ground. Common mode voltage is different from normal mode voltage (NMV) which is the voltage that exists between the two leads of an analog input. As shown in FIG. 1, the most common source of common mode noise is the difference in potential between two physically remote grounds 102 and 104. In poorly grounded systems, this potential difference can raise both the hot and neutral power lines 106 and 108 to electrical equipment 110 up to about 30 volts above the house power supply ground 102. Even in properly grounded house power systems, this voltage differential may be in the neighborhood of 1 to 2 volts.

While ground potential differences are the major source of common mode noise, they are not the only source. Among the other causes of common mode noise are improperly grounded signals from other equipment tied to the power lines and radio frequency signals from sources such as microwave induction heaters and motor control relays. All the described types of noise signals result in ground current which could disrupt the operation of the equipment powered by the power supply. For instance, a computer ground current can cause damage to the computer circuitry or loss of data due to power supply voltage perturbations when power on reset of the power supply occurs.

Proper design and testing in the laboratory usually eliminates most power source problems. However, in-plant testing has not uncovered common mode noise conditions encountered in the field that have resulted in operational problems or damage to computer equipment. The common mode noise conditions encountered in the field can be continual or intermittent noise signals. In any case, the most desirable situation would be to be able to test in the laboratories for common mode failure conditions, particularly those failure conditions encountered in the field, to eliminate susceptibility to the noise.

Therefore, it is an object of the present invention to evaluate electrical equipment for common mode noise susceptibility.

Another object of the invention is to provide a new common mode noise testing to complement extensive normal mode noise testing now performed on computer power supply systems.

A further object of the invention is to provide method and apparatus to simulate common; mode voltage conditions encountered in the field under laboratory conditions to diagnose power failures and modify the systems to overcome those failures.

BRIEF DESCRIPTION OF THE INVENTION

In accordance with the present invention, a test method and apparatus are provided to determine susceptibility of equipment to common mode noise problems. The equipment being tested is hooked up to a source of power with the power and neutral input terminals of the equipment isolated from the power source ground. Recorded common mode noise signals are then inserted between the equipment's neutral input terminal and the power source ground so that the equipment is subject to the combination of the power source voltage and the recorded common mode noise signals to reproduce the common mode noise conditions occurring at the time of the power supply problem. When the problem condition is reproduced by the test signals, modification of the power supply for the equipment can be undertaken to eliminate the reoccurrence of the problem condition.

A library of recordings of common mode noise voltage patterns result in equipment problems can be accumulated. When new equipment is designed, it can be subjected to all or a selected subset of these recorded common mode noise patterns to enable the production of a more stable product. Common mode noise tests of a power supply can be performed in conjunction with normal mode noise tests to see what combinations of common mode and normal mode noise patterns induce problems. Also, the power supply tests can be performed simultaneously with the testing of the equipment deriving power from the power supply to determine how power supply noise conditions effect equipment operations.

BRIEF DESCRIPTION OF THE DRAWINGS

FIG. 1 is a schematic diagram of a system subject to common mode noise or voltage.

FIG. 2 is a schematic diagram of a setup for common mode noise testing.

DETAILED DESCRIPTION OF THE INVENTION

Figure 3:
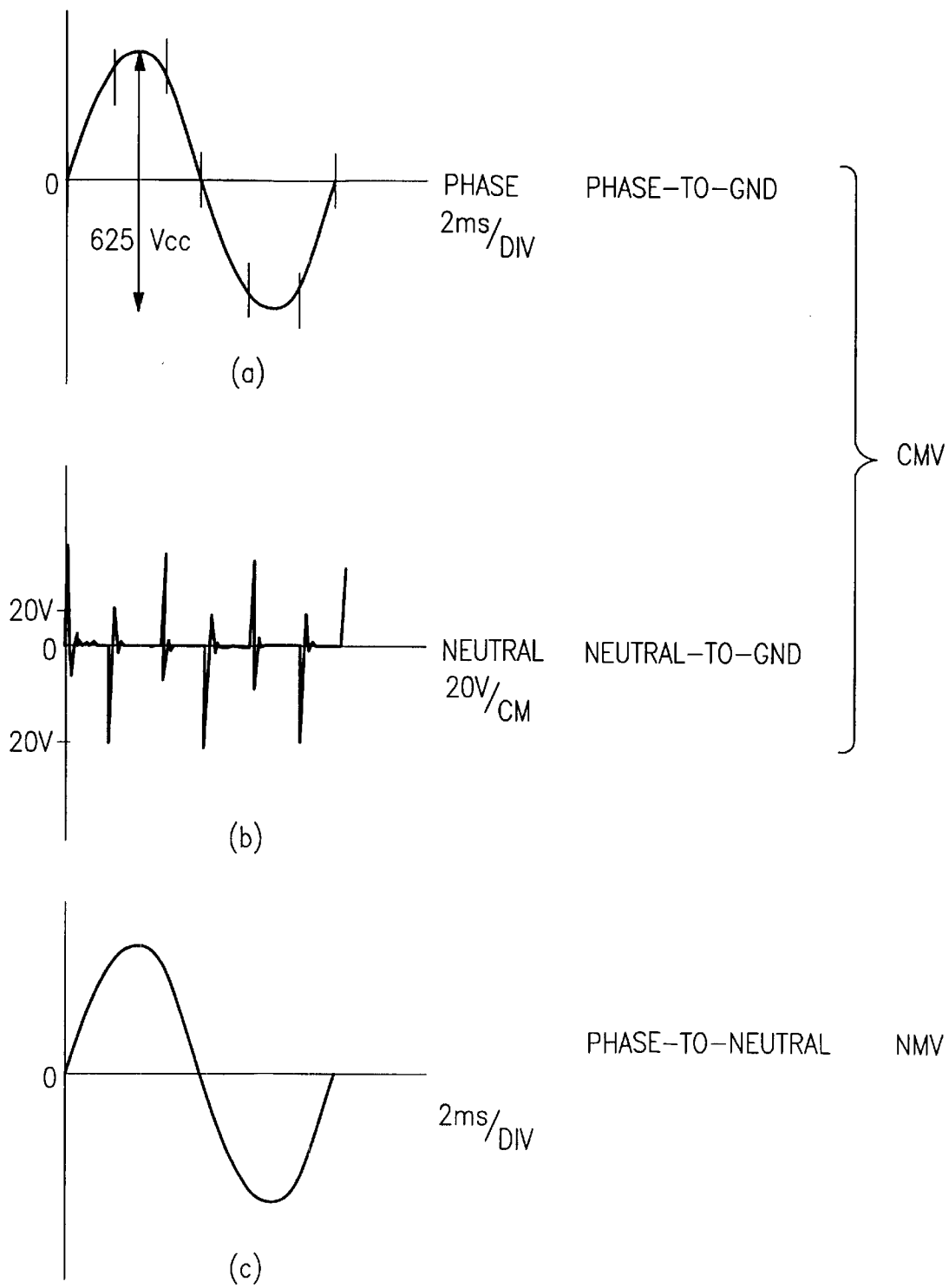
FIGS. 3a), b) and c) are waveforms of adverse conditions encountered during operation and testing of a power supply.

Referring again to FIG. 1, the common mode voltage component CMV of the power supplied to the equipment 110 may not be apparent by measurement of the normal mode voltages between the two lines 106 and 108 supplying the differential or normal mode voltage NMV to the equipment. Referring to FIG. 3, neutral to ground noise is apparent by measurement between the phase and ground as shown in FIG. 3(a), and between the neutral and ground lines as shown in FIG. 3(b). However, it is not apparent from a measurement of the voltage between the phase and neutral as shown in FIG. 3(c). Therefore, standard differential mode testing will not of necessity turn up problems resulting from common mode noise.

In accordance with the present invention, a new method and apparatus for testing for common mode voltage is provided. As shown in FIG. 2, a single phase 200 of a three phase utility power supply 202 is grounded at one side 204 and provided to house power source 206 over utility power lines 208 and 210. Power is supplied to the equipment under test through a noise filter 214, test apparatus 216 is connected across the grounded and hot terminals of the house power supply, and monitoring equipment 218 is provided to check the response of the equipment under test.

Figure 4:
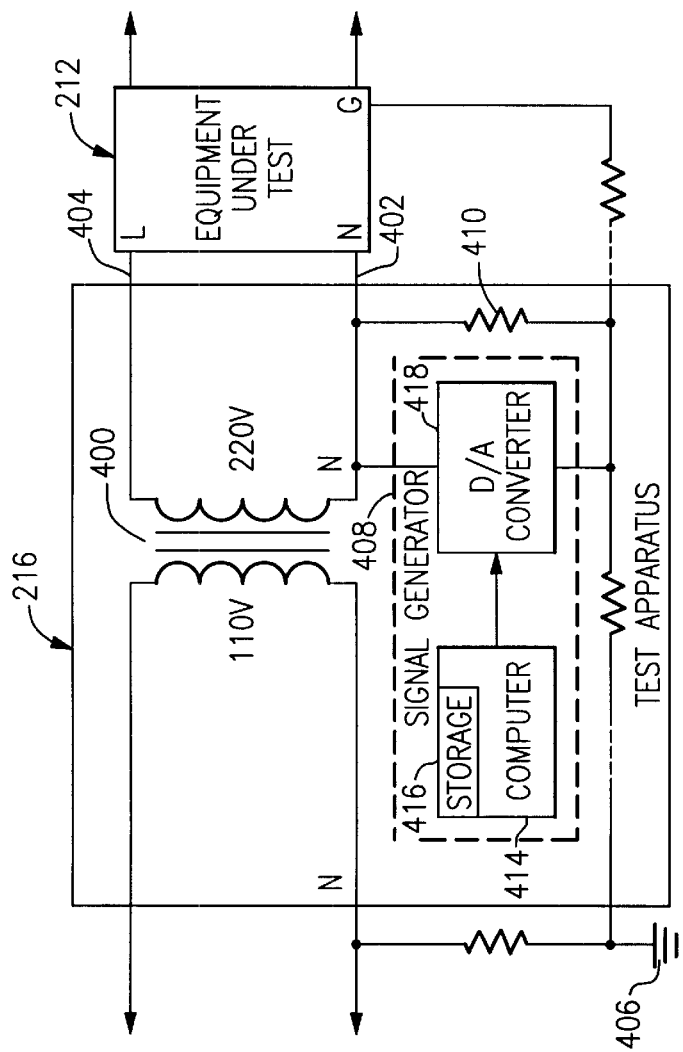
FIG. 4 is a schematic diagram of common mode test equipment in accordance with the present invention.

As shown in FIG. 4, the test equipment contains a transformer 400 that supplies power to the equipment under test 212. The magnitude of the voltage being supplied to the test equipment being listed will vary depending on the equipment's operating requirements. In the illustrated embodiment, 220 volts is supplied to the equipment 212 by using a 1 to 2 step up transformer 400. However, if the equipment under test has different powering requirements, the ratio of turns between the primary and secondary of the transformer can be selected to provide the necessary excitation potential.

During normal operation of the equipment under test 212, the provided 60 cycle excitation is grounded. However, the transformer 400 has an ungrounded secondary that isolates the power input terminals 402 and 404 of the equipment under test from the power supply ground. A signal generator 408 has its output in shunt with a resistor 410 connected between the neutral terminal 402 and house power ground 406 for introducing common mode voltage test signals. The ground terminal for the equipment under test and the noise generator and monitoring equipment ground terminals are connected to the house power ground.

In operation, substantially noise free 220 volt, 60 cycle excitation is provided by the filter 214 between the power and the ungrounded neutral terminals 404 and 402 of the equipment under test 212, and the captured common mode noise waveform of FIG. 3(b) is supplied by the noise generator 408 between power ground 406 and the ungrounded neutral terminal 402 thereby reproducing the voltages of FIGS. 3(a) and (b) between power ground 406 and terminals 404 and 402. Equipment can now be tested in the laboratory under the conditions experienced in the field and the equipment under test can be modified when the applied voltages product equipment failure.

The signal generator 408 includes a digital computer 414 having storage 416 in which digital data of the common mode waveform of FIG. 3(b) are stored along with digital data for other such common mode voltage waveforms that have resulted in equipment malfunctioning. During testing, the computer provides this digital data to a digital to analog converter 418 which takes the digital data and recreates the analog common mode voltage waveforms of FIG. 3(b). As pointed out previously, the reproduced waveform of FIG. 3(b) is applied between the neutral input 402 of the equipment under test and power ground, and is combined with the 60 cycle 220 volt output of the transformer 400 to reproduce the waveform of FIG. 3(a) on the hot input terminal 404 of the equipment under test 212. Therefore, common mode noise conditions experienced in the field are reproduced in the laboratory on testing the equipment.

As described above, the common mode error testing is performed with a clean 60 cycle power signal. However, the test can also be performed introducing normal mode noise signals along with the 60 cycle to check for failure conditions that may result from combinations of common mode and normal mode noise conditions. Furthermore, the tests can be run simultaneously with the testing of the processor driven by the power supply under test to detect computer error conditions resulting from common mode noise alone or in combination with normal mode noise. In addition, while a signal generator capable of reproducing previously experienced common mode voltage conditions that resulted in failure is described above, it is possible to generate common mode voltage conditions using a variable AC signal generator capable of producing 0 to 300 volts between 15 and 2000 Hz as part of testing new products under development.

Figure 5:
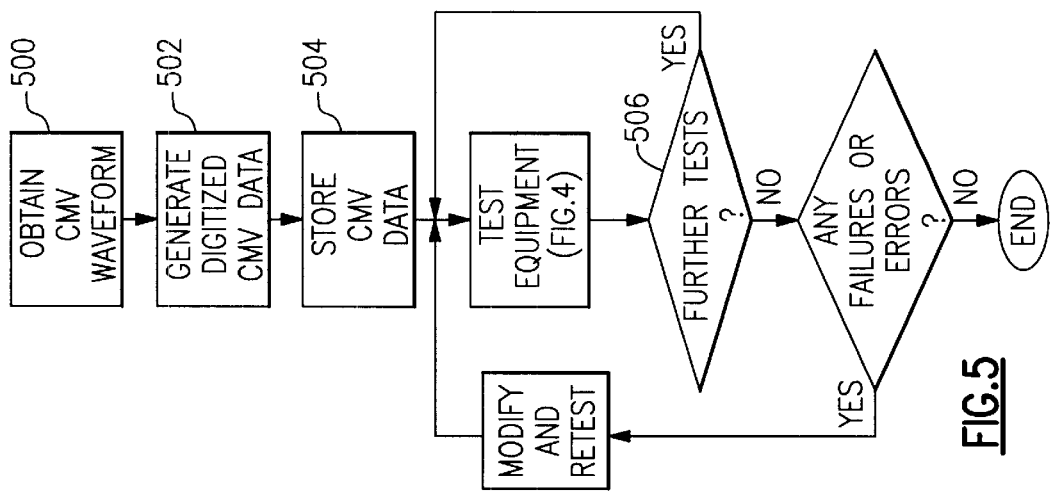
FIG. 5 is a flow diagram of a testing sequence in accordance with the present invention.

Referring to FIG. 5, the process of common mode noise testing can include obtaining common mode voltage waveforms 500 by recording common node voltages; particularly, neutral to ground voltages occurring during malfunctioning of the equipment under field conditions. The waveforms are reduced to digital data 502 and the data is placed in storage 504 for use with the tester of FIG. 4. The tester runs through a sequence 506 of the captured failure or error conditions experienced in the field. As pointed out above, these tests can be performed in isolation; simultaneously with normal mode noise tests of the power supply; and/or overall testing of the computer equipment.

While one embodiment of the invention has been described, modifications in the described equipment or method are possible without departing from the present invention. Therefore it should be understood that the invention is not limited to the described embodiment, but should be interpreted by the spirit and scope of the following claims.

We claim:

1. Apparatus for testing power supplies for response to common mode noise signals comprising:

a transformer with a primary winding connected across a grounded AC power source to receive power from the grounded AC power source and a secondary, winding without a direct connection to the ground for the grounded AC power source, coupled in shunt with power input terminals of a power supply under test for providing ungrounded AC power to the power input terminals;

a signal generator with its output coupled between a neutral terminal of the power input terminals and the power ground for the AC source to introduce common mode noise signals on the power input terminals;

a load in shunt with the output of the signal generator; and monitoring equipment coupled to equipment containing the power supply under test to check for problem incidents.

2. The apparatus of claim 1, including a filter for filtering normal mode noise signals from the AC power supplied to the power supply under test.

3. The apparatus of claim 1, wherein said signal generator includes:

a processor containing a memory with digital data of actual common mode error signals; and a digital to analog converter for reproducing the common mode noise signals that produce a problem condition.

4. A method of injecting common mode noise signals into electrical equipment when testing the electrical equipment comprising the steps of:

providing AC power from a grounded AC source to power input terminals of the electrical equipment under test through a transformer with a primary winding connected to the grounded source and a secondary winding, without any connection through the transformer to the ground for the AC power source, connected to the power terminals of the equipment under test for providing electrical power isolated from ground of the AC power source through the transformer;

inserting an output of a signal generator between the ground for the AC power source and a neutral terminal of the power input terminals for the equipment under test; and generating an output with the signal generator to cause a common mode noise condition at the power input terminals of the equipment under test while it is powered through the transformer from the grounded AC power source.

5. The method of claim 4 including the step of generating previously captured common mode noise signals with the signal generator to reproduce malfunctioning experienced during prior use of the equipment.

6. The method of claim 4 wherein the equipment is a power supply and testing is performed without introducing normal mode noise signals during the testing.

7. The method of claim 4 including monitoring the equipment under test for problem incidents.

8. The method of claim 7, including digitizing recorded common mode noise signals and storing the resultant digital data.

9. The method of claim 8, including the step of recording the common mode noise signals occurring during problem incidents of the electrical equipment and/or other equipment.

10. The method of claim 8, wherein the electrical equipment is a computer system with a power supply and the application of the common noise condition is performed during testing of logic circuits of the computer system.

11. The method of claim 10, wherein normal mode error signals are introduced during the testing.

12. The method of claim 8, including the step of reproducing the common mode noise signals from the digitized data with the signal generator and using those reproduced noise signals to reproduce the problem incidents.

* * * * *